US008609192B2

(12) United States Patent
Borrel

(10) Patent No.: US 8,609,192 B2
(45) Date of Patent: Dec. 17, 2013

(54) METHOD AND DEVICE FOR CONTROLLING OXIDIZING-REDUCING OF THE SURFACE OF A STEEL STRIP RUNNING CONTINUOUSLY THROUGH A RADIANT TUBES FURNACE FOR ITS GALVANIZING

(75) Inventor: Pierre-Jérôme Borrel, Saint Chamond (FR)

(73) Assignee: Siemens VAI Metals Technologies SAS, Saint-Chamond (FR)

(*) Notice: Subject to any disclaimer, the term of this patent is extended or adjusted under 35 U.S.C. 154(b) by 596 days.

(21) Appl. No.: 12/676,167

(22) PCT Filed: Jul. 4, 2008

(86) PCT No.: PCT/FR2008/000981
§ 371 (c)(1),
(2), (4) Date: Mar. 3, 2010

(87) PCT Pub. No.: WO2009/030823
PCT Pub. Date: Mar. 12, 2009

(65) Prior Publication Data

US 2010/0173072 A1 Jul. 8, 2010

(30) Foreign Application Priority Data

Sep. 3, 2007 (FR) ..................................... 07 57331

(51) Int. Cl.
*C23C 16/00* (2006.01)

(52) U.S. Cl.
USPC .............. 427/248.1; 427/255.23; 427/225.25; 427/225.26; 427/255.28; 427/255.5; 118/641; 118/719; 118/725; 118/728; 118/729

(58) Field of Classification Search
None
See application file for complete search history.

(56) References Cited

U.S. PATENT DOCUMENTS 3,936,543 A 2/1976 Byrd et al.
4,870,947 A 10/1989 Kawamoto
5,605,104 A * 2/1997 Gross et al. .................. 110/346
5,772,428 A * 6/1998 Van Den Sype et al. ....... 432/23

(Continued)

FOREIGN PATENT DOCUMENTS

EP 1285972 A1 2/2003
EP 1457580 A1 9/2004

(Continued)

OTHER PUBLICATIONS

J. Mahieu et al: "Galvanizability of High Strength Steels for Automotive Applications", Metallurgical and Materials Transactions, Nov. 1, 2001, p. 2905-2908, XP002480933.

*Primary Examiner* — Timothy Meeks
*Assistant Examiner* — Michael P Rodriguez
(74) *Attorney, Agent, or Firm* — Laurence A. Greenberg; Werner H. Stemer; Ralph E. Locher

(57) ABSTRACT

A method for guaranteeing the oxidation of a strip designed to prevent the selective oxidation of alloy elements of the steel in a continuous steel strip galvanizing annealing furnace having a pre-heating section and a hold section and provided only with radiant tubes. The oxidation of the strip is designed to prevent the selective oxidation of elements of the steel alloy. The novel method includes the following steps: installation of at least one modified tube capable of injection an oxidizing medium at least one point in the oven heating section and/or at least one point in the hold section and injection of the oxidizing medium by means of the modified tube(s), the oxidizing medium having a composition such that in the conditions of the temperature of the oxidizing medium and the steel strip and as a function of the chemical composition of the strip said medium has a dew point which guarantees an in-depth oxidation of the alloy elements of the steel strip.

10 Claims, 4 Drawing Sheets

(56) References Cited

U.S. PATENT DOCUMENTS

| | | | | |
|---|---|---|---|---|
| 6,241,797 | B1 * | 6/2001 | Edlinger | 75/10.14 |
| 6,913,658 | B2 | 7/2005 | Delaunay et al. | |
| 2003/0047255 | A1 | 3/2003 | Delaunay et al. | |
| 2004/0177903 | A1 | 9/2004 | Francois | |
| 2009/0123651 | A1 * | 5/2009 | Okada | 427/319 |
| 2010/0062163 | A1 * | 3/2010 | Bordignon et al. | 427/321 |

FOREIGN PATENT DOCUMENTS

| | | | | |
|---|---|---|---|---|
| EP | 1936000 | A1 | | 6/2008 |
| JP | 58151417 | A | | 9/1983 |
| JP | 58214712 | A | * | 12/1983 |
| JP | 60251265 | A | | 12/1985 |
| JP | 01159511 | A | | 6/1989 |
| JP | 2285057 | A | | 11/1990 |
| JP | 10185131 | A | | 7/1998 |
| JP | 2003342645 | A | | 12/2003 |
| JP | 2007146241 | A | | 6/2007 |
| WO | 2005017214 | A1 | | 2/2005 |
| WO | 2007043273 | A1 | | 4/2007 |
| WO | WO 2007043273 | A1 | * | 4/2007 |
| WO | WO 2007109865 | A1 | * | 10/2007 |

* cited by examiner

METHOD AND DEVICE FOR CONTROLLING OXIDIZING-REDUCING OF THE SURFACE OF A STEEL STRIP RUNNING CONTINUOUSLY THROUGH A RADIANT TUBES FURNACE FOR ITS GALVANIZING

BACKGROUND OF THE INVENTION

Field of the Invention

The invention relates to the continuous galvanizing of steel strips especially AHSS with high silicon, manganese and aluminium content and, in particular, to the facilities comprising a radiant tubes furnace without direct flame heating zone.

The evolution of work materials used in car manufacturing has led successively to the galvanizing of steel strips before their use by the car manufacturers in order to improve the corrosion resistance of the chassis and body steel components. Then, so as to lighten the structures while improving the resistance to the vehicles collapse due to a collision (crash), new steel grades with a very high yield point having a high elongation capacity. Such work materials, called AHSS (Advanced High Strength Steels) involve specific chemical compositions and operating methods which make conspicuous some families of steel such as "DP" or Dual Phase steels, "TRIP" or TRansformation Induced Plasticity steels . . . . These steels, in particular, are described in the "Advanced High Strength Steel (AHSS) application guidelines" prepared by the "Committee on Automotive Applications" of the International Iron & Steel Institute.

These steels have opened up new horizons in the cars design but raise a number of problems for steel manufacturers. Indeed, some of their alloy components such as manganese, silicon, aluminium, chromium . . . make a thin layer of oxides on the steel strips surface during the annealing operation preceding the dipping in the galvanizing bath. This selective oxidation harms the zinc "wettability" and thus the quality of the coating. These phenomena are due to diffusion processes of the highly oxidizable alloy components towards the strip surface where they can oxidize even in the furnaces radiant tubes zones wherein the atmosphere is yet reducing for the iron oxides.

Many studies have been led in order to understand the kinetics of these oxidizing processes and to bring solutions to the problems raised during the galvanizing. The "Meeting report ECSC steel workshop Galvanizing of steel strip, Luxembourg, Feb. 27-28, 2002" summary report from the CECA (ESCC) gives a list of reference documents mostly stemming from works led under the aegis of the European Community.

Among the described solutions in order to ensure a high-standard galvanizing appear surface pretreatments of the steel strips before their use in the continuous galvanizing facilities (chemical treatments, electrodeposition or coating in vapour phase with a very thin layer of iron, nickel, copper . . . ), mechanical or chemical removal operations of the oxides after annealing and before the going in the zinc bath.

Another way has been particularly studied which consists in subjecting, in the annealing furnace, the strips surface to temperatures and atmosphere conditions fit for quickly and deeply oxidizing the alloy components and thus for avoiding their later migration towards the surface. During this operation, a layer of oxides is forming which will be removed later on in the following zones of the annealing furnace under reducing atmosphere. Such techniques of controlled oxidizing/reducing have been the object of many studies and experimentations. The "Enhancing the wettability of High Strength Steels during Hot-Dip galvanizing" document presented within the scope of the "Galvatech 2004" conference describes the physical principles which govern the controlled forming then the reducing of this layer of oxides. Patent JP 02-285057 describes an oxidizing phase between 400 and 700° C. in a slightly oxidizing atmosphere then a reducing phase between 600 and 800° C. in reducing atmosphere, it gives ranges of temperatures and gasses composition ($O_2$, $N_2$ and $H_2$ contents). Patent EP 1 285 972 describes the same principle. Those two patents however remain very general and do not clearly reveal the practical ways to control the reactions.

Patent EP 1 457 580 describes a facility allowing to realize the oxidizing phase in a specific enclosure where the strip is heated by induction or combustion of a gas, in oxidizing atmosphere, between 100 and 400° C.

U.S. Pat. No. 3,936,543 describes a method for operating annealing furnace not aiming at the specific coating of AHSS steels but allowing to avoid the use of cleaning flux during the galvanizing thanks to the oxidizing then to the surface reducing of steel strips with carbon. The annealing furnace preceding the galvanizing bath is a conventional furnace comprising a direct flame heating zone (DFF) and a temperature holding radiant tubes zone (RTF). The surface oxidizing is obtained in the DFF zone by adjustment of the combustion in overstoichiometric conditions so that the burnt gasses present a controlled excess of oxygen. The reducing is obtained in the RTF zone which comprises at least 5% of hydrogen, the rest being nitrogen. The principle given by this patent can be applied to controlled oxidizing/reducing of AHSS steels. It has the advantage not to require additional oxidizing facilities and to use the mixed DFF/RTF galvanizing furnaces without major modifications.

However, the galvanizing furnaces do not comprise all the required DFF zones to easily perform the oxidizing and many are only using radiant tubes. Now these furnaces, despite their controlled atmosphere, do not prevent the selective oxidizing of the alloy components. Patent WO 2005/017214 recommends two possibilities to solve the problem. The first one consists in using a direct flame combustion chamber separated from the RTF annealing furnace and from which the burnt gasses are collected in order to inject them in the furnace. The second one consists in setting up a direct flame burner in a section of the furnace enclosure. In both cases, the burnt gasses supply with the necessary oxidizing atmosphere in composition conditions of course depending on the temperature of the strip and on the one of the gasses. The reducing is then customarily obtained by going through a nitrogen and hydrogen mixture. These two possibilities require a modification of the existing facilities (additional combustion enclosure and delivery ducts towards the furnace, assembling of a burner inside the furnace). Furthermore, they freeze the position of the oxidizing zone in the annealing furnace and, thereby, freeze the temperature of the oxidizing zone, which does not allow a high flexibility of use.

BRIEF SUMMARY OF THE INVENTION

The method and the device for its operating subject of the present invention bring the solution to these two problems.

On the whole the invention consists in injecting an oxidizing medium in a section of a radiant tubes furnace, especially with nitrogen/hydrogen atmosphere, thanks to one or several tubes, in particular specially modified and able to be set up in place of any of the existing tubes. According to the temperatures range chosen for the oxidizing, this injection can be performed in any section of the furnace, preferentially in the pre-heating section.

The medium must have, according to the strip temperature and to the chemical composition of said strip, a dew point such that the alloy components like silicon, manganese, aluminium, chromium are deeply oxidized and do not have the possibility to migrate towards the surface anymore. On the whole, this dew point is greater than −20° C.

To reach this goal, the injected medium can be water vapour or air or a high-oxygen mixture. It can also be the product resulting from the combustion of an overstoichiometric air or of an oxygen enriched air or of an oxygen/fuel in a burner.

Thus, the invention particularly concerns a method ensuring, in a continuous galvanizing annealing furnace for steel strips comprising a pre-heating section and a holding section and equipped only with radiant tubes, the oxidizing of the strip aiming at preventing the selective oxidizing of the steel alloy components, characterized in that it comprises the following steps:

- the setting up in at least one place of the furnace preheating section and/or in at least one place of the furnace holding section, of at least one modified tube able to inject an oxidizing medium; and
- the injection of the oxidizing medium through the modified tube(s);
- the oxidizing medium having a composition such that, in the temperature conditions of the oxidizing medium and of the steel strip, and according to the chemical composition of the strip, it has a dew point ensuring a deep oxidizing of the steel strip alloy components.
- The control of this selective oxidizing preferably involves the measurement of the dew point in the setting up zone(s) of the modified tube(s). This measurement can be performed by dew point transducers set up a fixed way and running in closed loop with the organs of regulation of the flow rate of the oxidizing medium injected by the nozzles for oxidizing medium and/or, of adjustment of the burners.

The invention as well concerns a device ensuring the management, in a pre-heating section and/or a holding section of a continuous galvanizing annealing furnace for steel strips equipped only with radiant tubes, of at least an oxidizing zone aiming at preventing the selective oxidizing of the steel alloy components, by injection of an oxidizing medium in the oxidizing section, characterized in that it comprises at least one tube comprising at least one leg provided with calibrated holes allowing the oxidizing medium into the oxidizing zone.

The injection means for the oxidizing medium can be either a nozzle ensuring the supply of the tube with a hot oxidizing medium such as water vapour, air or high-oxygen gas, or a burner supplying the tube with a product resulting from the combustion of an overstoichiometric mixture of air/fuel, of a stoichiometric mixture of oxygen enriched air/fuel or of a stoichiometric mixture of air/fuel oxygenated within the non explosibility limits.

The modified tube(s) aimed at supplying with the oxidizing medium required for the oxidizing of the strip is (are), for example, a U-shaped tube of which an input leg is equipped at its end with an injection device for water vapour or for air pre-heated or not, oxygen enriched or not or for oxygen and of which the leg opposite the input leg is sealed at its end, at least one of the legs preferably the leg opposite the input leg, is pierced with calibrated holes letting said medium go through.

The U-shaped tube can be replaced with conventional tube of any shape such as, for example, P-shaped, double P-shaped, W-shaped or finger-shaped.

According to another characteristic of the invention, the radiant tube aimed at supplying with the oxidizing medium is a P-shaped tube having an input leg equipped with a burner at its end and of which at least one of the legs, preferably the leg opposite the input leg, is pierced with calibrated holes allowing burnt gasses into the furnace enclosure. The leg opposite the input leg comprising the burner can allow a part of the burnt gasses to escape outside the furnace through a calibrated orifice or comprise a heat exchanger device allowing to pre-heat the combustion air with the burnt gasses. The P-shaped tube can be replaced with conventional tube of any shape such as, for example, U-shaped, W-shaped, double P-shaped or finger-shaped. The burner(s) is (are) supplied with an overstoichiometric mixture of air/fuel, a stoichiometric mixture of oxygen enriched air/fuel or a stoichiometric mixture of air/fuel oxygenated within the non explosibility limits.

The tubes equipped with burner or with nozzle, whatever their type is, are directly interchangeable with the existing ones. They can be set up on demand according to the temperature chosen for the oxidizing or set up permanently in different places of the furnace. In that case, they are operated according to the choice of temperature one wishes to oxidize the strip at, therefore according to the location of the tube in the furnace.

Another advantage of the furnace is to place the oxidizing medium injection exactly where it is needed, that is to say very close to the two faces of the steel strip and to be able to benefit from the turbulence localized effect due to the contact with the strip which helps the reactions between the medium and the strip.

BRIEF DESCRIPTION OF THE SEVERAL VIEWS OF THE DRAWING

What comes afterwards of the description refers to the annexed drawings which represent, respectively.

DESCRIPTION OF THE INVENTION

Figure 1:
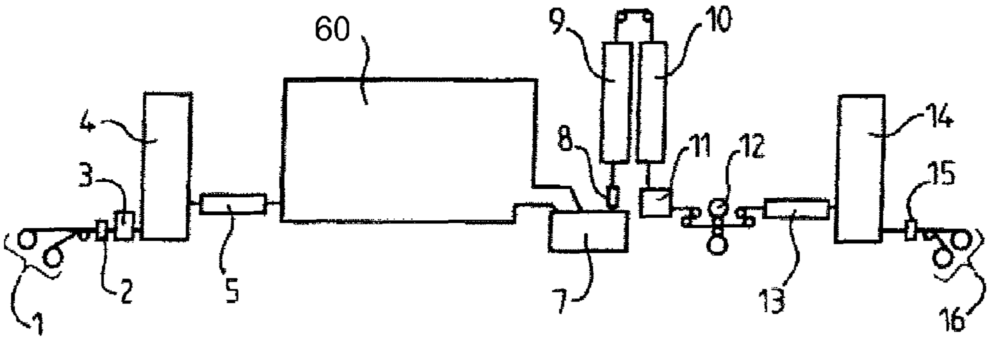
FIG. 1, a galvanizing line equipped with a radiant tubes furnace.

The coating of the steel strips with zinc or zinc-based alloys is made on continuous galvanizing lines such as shown in FIG. 1 and which typically comprise:

- An input section with one or two strip unwinding devices 1, a squaring shear 2, a weld joining machine 3 allowing to join the tail of a strip stemming from one of the unwinding devices to the head of the next strip stemming from the other unwinding device and thus ensuring a continuous running of the line, a strip looper car system 4 which gives strip back downstream accumulated beforehand when the unwinding upstream from the looper car system is stopped to make the weld joining.
- A section 5 of degreasing of the cold rolled strips or of acid pickling of the hot rolled strips.

An annealing furnace 60 ensuring the heating, the holding at annealing temperature, the cooling, the ageing when required and the setting at controlled temperature of the strip before its going in the molten zinc bath.

A galvanizing section proper with the zinc bath 7 wherein is dipped the strip, an excess liquid zinc removal device 8 possibly an induction galvanealing furnace 9, a cooling 10 and a tempering tub 11.

An exit section with a Skin-Pass set 12, a passivating section 13, an output looper car system 14, a shear 15 and one or two winding devices 16 working in turn.

Figure 2:
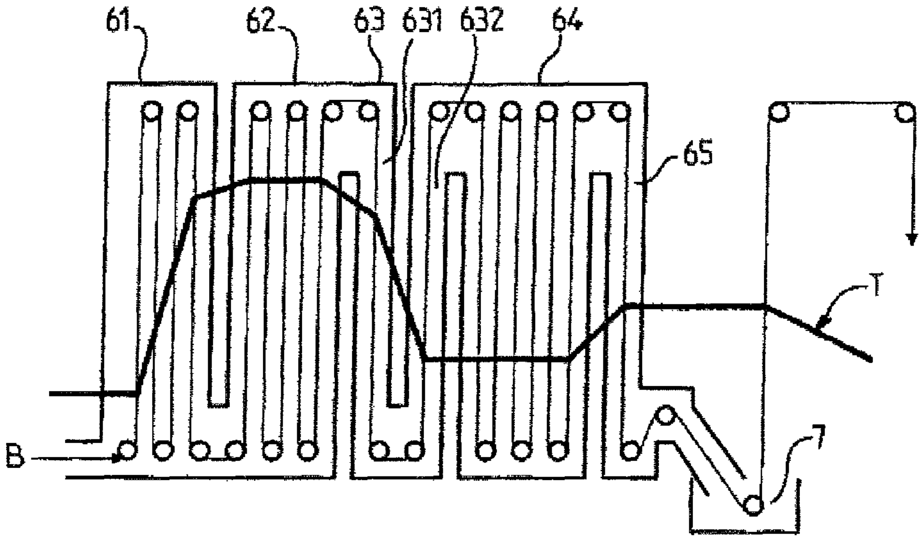
FIG. 2, the movement of the steel strip from its going into the furnace up to its going out of the zinc bath as well as its temperature variation, FIG. 3 to 6, radiant tubes according to the invention equipped with burners, FIG. 7 to 8, radiant tubes according to the invention equipped with nozzles.

FIG. 2 describes the layout of the different sections of a galvanizing annealing furnace with radiant tubes and, superimposed, the temperature evolution of the strip B during its movement inside the furnace (curve T). Said strip B goes in the furnace 60 through a pre-heating section 61 followed by a temperature holding section 62, by a cooling section 63 with cooling means slow 631 and fast 632, by an ageing section 64 and by a section 65 of setting at the temperature required for the dipping in the zinc bath 7.

As it is known in itself, the heating especially in the section of pre-heating 61 and of holding 62 of the furnace 60 is obtained thanks to radiant tubes.

Figure 3:
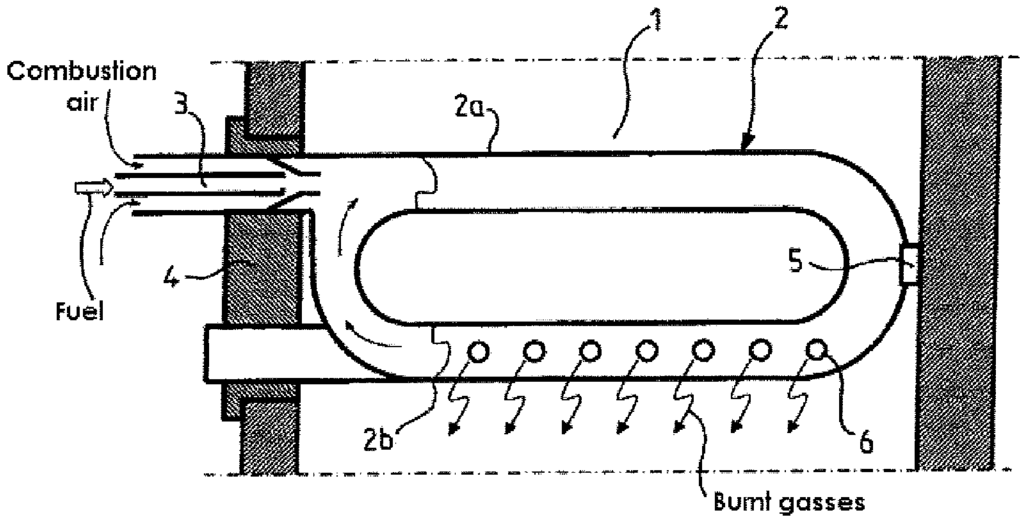

According to a first embodiment of the invention shown in FIG. 3, a radiant tube 2, P-shaped, is set up in the enclosure 1 of a galvanizing annealing furnace, for example a pre-heating or holding section. It is assembled by a bracket 5 and a fixture 4. A burner 3 supplied with fuel and with combustion air is placed at the end of the input leg 2*a* of the tube 2 and provides the tube inside with high-temperature burnt gasses. These burnt gasses are mainly diffused inside the enclosure 1 thanks to calibrated holes 6 bored in the leg 2*b* of the tube, opposite the input leg 2*a*. This leg 2*b* is sealed at its end so that the burnt gasses partly recirculate inside the tube.

Figure 4:
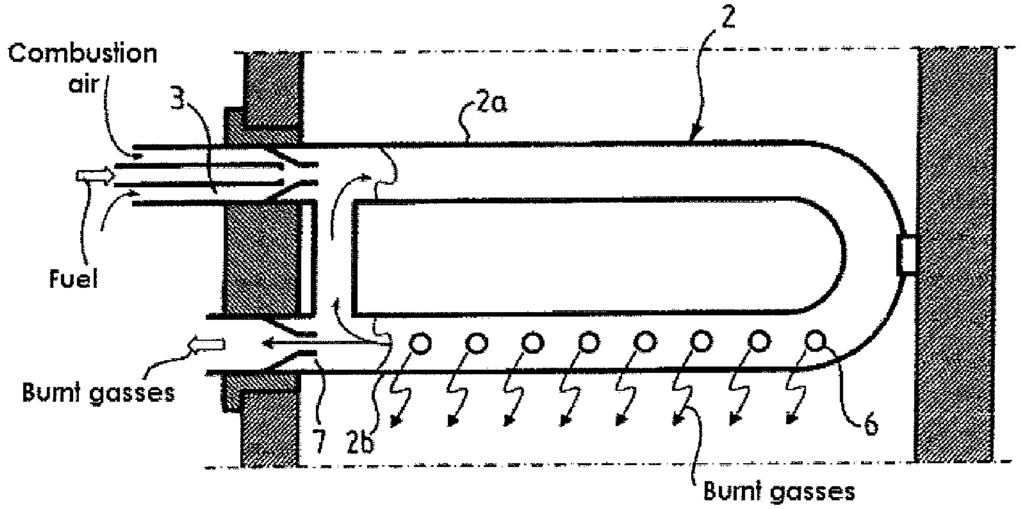

As a variant version, as shown in FIG. 4, the leg 2*b* of the P-shaped tube 2 opposite the burner 3 is equipped with a calibrated or adjustable device 7 allowing part of the burnt gasses to escape towards the outside the furnace.

Figure 5:
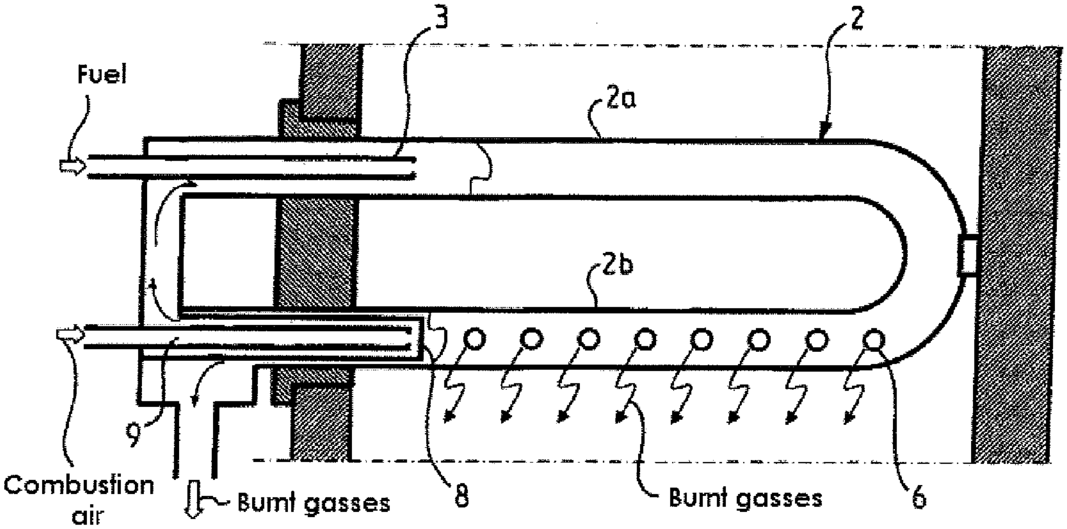

In another variant version shown in FIG. 5, the leg 2*b* of the P-shaped tube opposite the burner 3 is equipped with a reheating device 8, 9 for the combustion air thanks to the burnt gasses.

Figure 6:
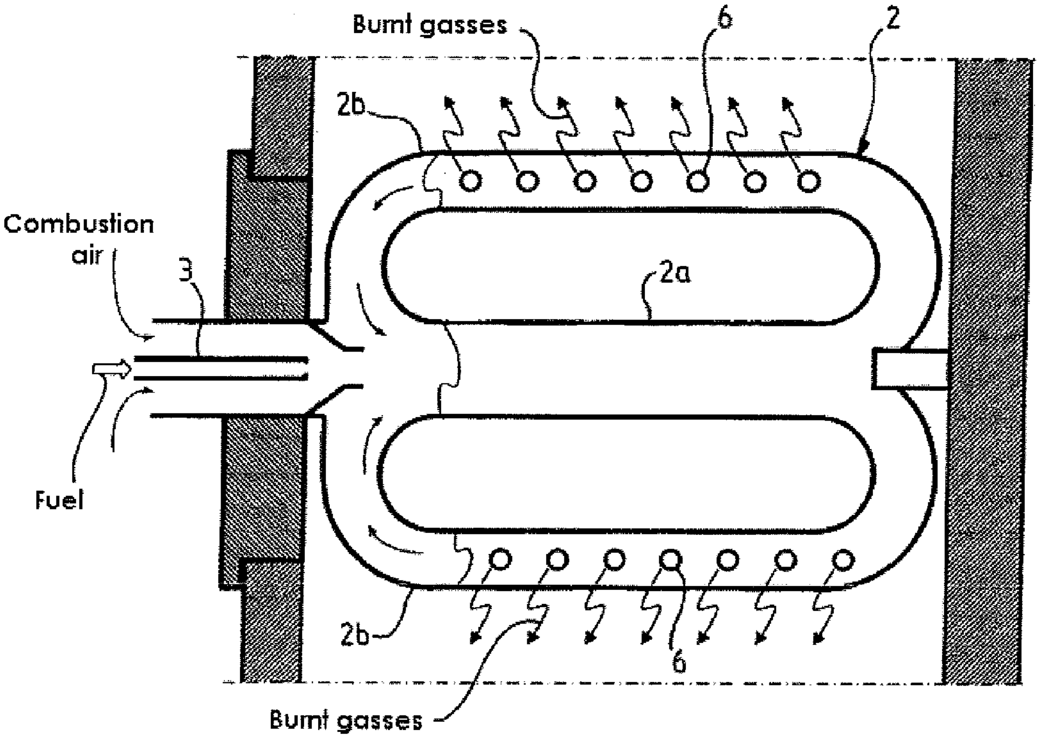

Finally, the radiant tube can be the double P-shaped type as shown in FIG. 6. In that case, as shows FIG. 6, the burner 3 is placed in the open end of the central input leg 2*a* of the tube 2. The holes 6 are then preferably bored in each one of the opposite legs 2*b* located on either side of the central leg 2*a*.

Figure 7:
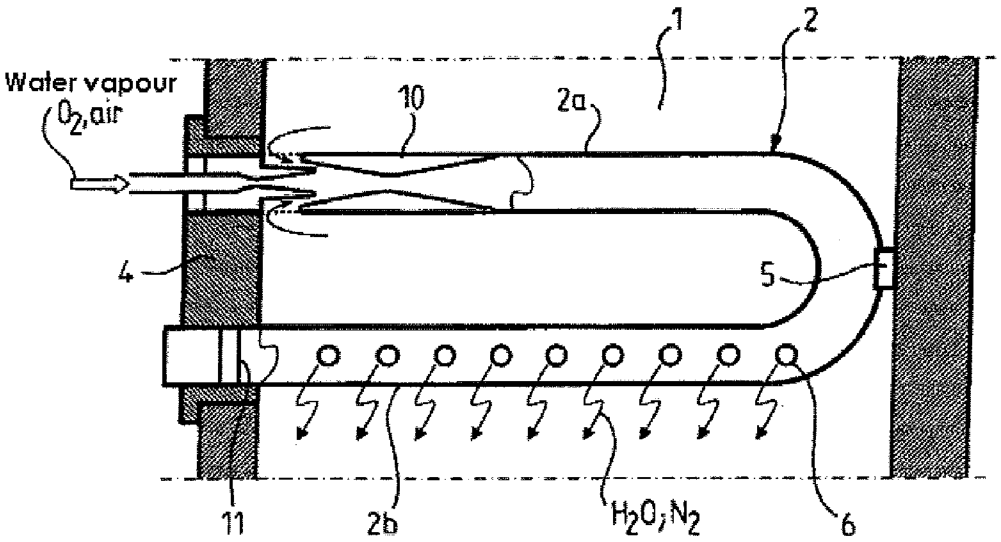

According to a second embodiment of the invention shown in FIG. 7, an U-shaped tube 2 is set up in the enclosure 1 of a galvanizing annealing furnace. It is assembled by a bracket 5 and a fixture 4. A nozzle 10 supplied with oxidizing gas under pressure such as water vapour, air or a high-oxygen mixture provides the tube 2 inside with a mixture of oxidizing gas and of high-temperature HNx mixture present in the enclosure of the furnace. This mixture is diffused inside the enclosure 1 thanks to calibrated holes 6 bored in the leg 2*b* opposite the input leg 2*a*. The end of the leg 2*b* opposite the input leg 2*a* comprising the nozzle is sealed with a plug 11.

Figure 8:
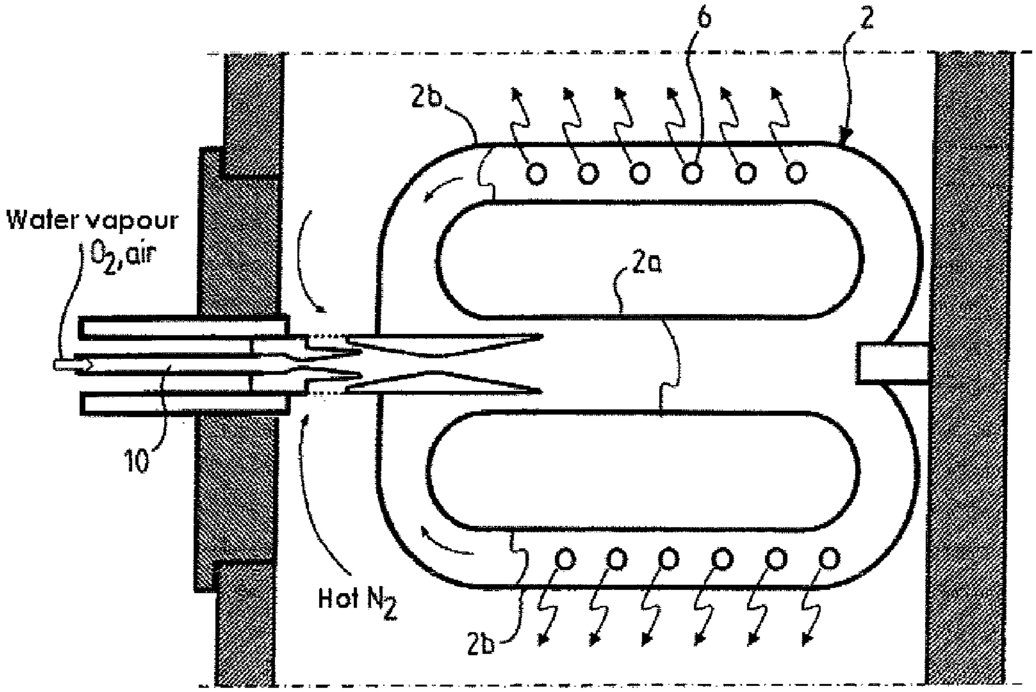

As a variant version shown in FIG. 8, the radiant tube 2 can be the double P-shaped type similar to the one shown in FIG. 6, the burner being replaced with a nozzle 10.

The nozzles are static devices not requiring any other energy than the one of the water vapour under pressure from 8 to 10 bars which is available in the metallurgical facilities.

On another hand, the expansion energy in the enclosure of the furnace leads to an effect of stirring and of circulation which avoids the use of ventilators. The energy cost of the method is therefore very limited.

The invention claimed is:

1. In a continuous galvanizing annealing furnace for a steel strip, the furnace having a furnace pre-heating section and a furnace holding section and being equipped with radiant tubes without direct flame zone, a method of oxidizing the steel strip in an oxidizing zone and preventing a selective oxidation of steel alloy components of the steel strip, the method which comprises:

providing at least one modified tube capable of injecting an oxidizing medium in at least one region of the furnace pre-heating section and/or in at least one region of the furnace holding section, the at least one modified tube including at least one leg formed with calibrated holes allowing the oxidizing medium into the oxidizing zone;

replacing at least one of the radiant tubes with the at least one modified tube for positioning the calibrated holes in the furnace; and injecting the oxidizing medium through the at least one modified tube; and setting a composition of the oxidizing medium such that, in the temperature conditions of the oxidizing medium and of the steel strip, and according to a chemical composition of the strip, the oxidizing medium has a dew point ensuring a deep oxidation of the steel alloy components of the steel strip.

2. The method according to claim 1, wherein the composition of the medium is such that, in the temperature conditions of the medium and of the strip, and according to the chemical composition of said strip, the medium dew point is greater than −20° C.

3. The method according to claim 1, which comprises injecting the oxidizing medium by way of a nozzle and selecting water vapor, air, or a high-oxygen gas as the oxidizing medium.

4. The method according to claim 1, which comprises generating the medium by combusting in a burner, one of an overstoichiometric mixture of air/fuel, a stoichiometric mixture of oxygen-enriched air/fuel, or a stoichiometric mixture of air/fuel oxygenated within non explosibility limits.

5. The method according to claim 1, which further comprises measuring an oxidizing medium dew point in furnace sections where the modified tubes are set up and regulating an oxidizing medium flow rate inside the tubes in closed loop control with the dew point measurement.

6. The method according to claim 1, which comprises providing the modified tube with a shape selected from the group consisting of a U-shape, a W-shape, a P-shape, and a double P-shape, and the modified tube having an input leg provided with a burner generating combustion gasses forming the oxidizing medium, and a leg opposite the input leg.

7. The method according to claim 1, which comprises providing the modified tube with a shape selected from the group consisting of a U-shape, W-shape, P-shape, or double P-shape and the modified tube having an input leg provided with a burner generating combustion gasses forming the oxidizing medium, and a leg opposite the input leg, the leg opposite the input leg has a sealed end.

8. The method according to claim 1, which comprises providing the modified tube with a shape selected from the group consisting of a U-shape, W-shape, P-shape, or double P-shape and the modified tube having an input leg provided with a burner generating combustion gasses forming the oxidizing medium, and a leg opposite the input leg, the leg opposite the input leg has an end formed with a calibrated orifice to allow escape a part of combustion gasses.

9. The method according to claim 1, which comprises providing the modified tube with a shape selected from the group consisting of a U-shape, W-shape, P-shape, or double P-shape, the modified tube having a heat exchanger device to pre-heat a burner supply gas by way of the combustion gasses.

10. The method according to claim 1, wherein the modified tube has a shape selected from the group consisting of a U-shape, a W-shape, a P-shape, and a double P-shape, ands the modified tube has an input leg provided with a nozzle for injecting the oxidizing medium and an opposite leg with a sealed end.

* * * * *